US006407683B1

(12) United States Patent
Dreibelbis

(10) Patent No.: US 6,407,683 B1
(45) Date of Patent: Jun. 18, 2002

(54) OPTIMIZED PERFORMANCE INCREMENTAL ENCODER WITH ERROR DETECTION CAPABILITY

(75) Inventor: John David Dreibelbis, Radnor, PA (US)

(73) Assignee: Tyco Electronics Logistics AG (CH)

(*) Notice: Subject to any disclaimer, the term of this patent is extended or adjusted under 35 U.S.C. 154(b) by 0 days.

(21) Appl. No.: 09/626,751

(22) Filed: Jul. 27, 2000

(51) Int. Cl.[7] .......................... H03M 1/48; G05B 11/01
(52) U.S. Cl. ........................................ 341/111; 318/560
(58) Field of Search ............................ 360/78.11, 77.03, 360/78.04; 341/13, 111, 115, 11; 250/231; 318/560, 600, 608; 324/161; 388/812

(56) References Cited

U.S. PATENT DOCUMENTS

| 4,355,279 A | * | 10/1982 | Younge ................... 324/161 |
| 4,558,304 A | * | 12/1985 | Wand ....................... 341/115 |
| 4,792,870 A | * | 12/1988 | Pinson .................... 360/78.14 |
| 5,021,781 A | * | 6/1991 | Salazar et al. ................ 341/13 |
| 5,254,919 A | * | 10/1993 | Bridges et al. ............. 318/560 |
| 6,037,735 A | * | 3/2000 | Janosky et al. ............. 318/608 |

* cited by examiner

Primary Examiner—Patrick Wamsley
(74) Attorney, Agent, or Firm—John B. Sowell-ATY

(57) ABSTRACT

In an incremental encoder signal processing system there is provided a pair of sensor/encoders adapted to generate a quadrature pair of analog positioning signals that are converted to digital signals and processed to produce a digital position vector and a digital error signal. The digital position vector is processed in a novel logic analyzer to determine if sequential position vectors are indicative of an invalid change of state. The digital position vector signal is filtered in a novel low pass digital filter and the before-and-after signals at a plurality of states of the digital filter are analyzed and compared to detect conditions which permit the system to produce optimum rates of change in the servo-controller which controls a servo-drive at optimum speeds without creating error conditions and to detect error conditions in the sensor/encoder.

17 Claims, 8 Drawing Sheets

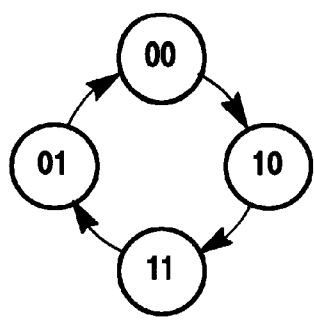
Figure 11
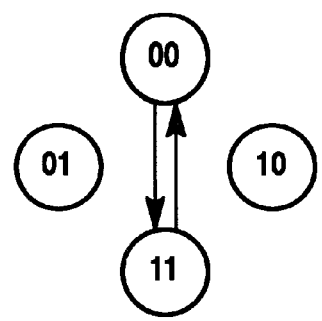
Figure 13
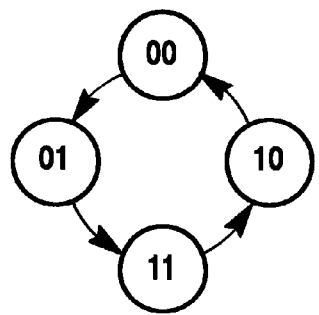
Figure 12
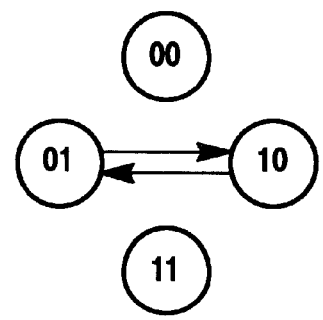
Figure 14
| TIME T | LEGAL @ TIME T+1 | ILLEGAL @ TIME T+1 |
|---|---|---|
| 00 | 00, 01 OR 10 | 11 |
| 01 | 01, 11 OR 00 | 10 |
| 11 | 11, 01 OR 10 | 00 |
| 10 | 10, 11 OR 00 | 01 |
Figure 15

OPTIMIZED PERFORMANCE INCREMENTAL ENCODER WITH ERROR DETECTION CAPABILITY

BACKGROUND OF THE INVENTION

1. Field of the Invention

The present invention relates to incremental position encoders and position interpolators and circuits for generating change of position signals with a high degree of accuracy. More particularly, the present invention relates to real time diagnostic and correction circuits for improving incremental encoder servo-signal performance at low and high speeds.

2. Description of the Prior Art

Rotary and linear encoders are well known to those skilled in the encoder art and it is also well known that when encoder sensors are moved relative to a rotary or linear scale, they may produce a square wave or sinusoidal analog output signal. These signals may be processed and counted to determine relative movement of the scale to the sensor head. When two sensor heads are employed in an incremental encoder system, one is phase-displaced 90 degrees from the other so that the simultaneous effective outputs may represent both magnitude and direction.

Encoder systems are employed to generate velocity signals by calculating the change of relative position as a function of time. The ability of a servo-positioner to perform its positioning function is dependent on the encoder system's resolution accuracy and its ability to generate both position and velocity information.

Low velocity speeds generate signals which are unstable. This causes dithering and hunting in the servo-positioner being driven. It is also possible to incur spikes, blips and distortions at low critical speeds from noise coupling of the servomotor and other sources in the encoder system.

High or peak velocity speeds can produce loss of position due to illegal state changes as well from as the aforementioned spikes, blips and distortions.

Blips and distortions may also be caused by electronic noise, defective encoders and/or sensors as well as dirty or cracked or scratched encoder scales.

Heretofore, the manufacturers of encoders specified the preferred range of operable speeds to be used with their encoders. Customer/users are also aware that there is a range of acceptable speeds for encoders that should be even more restrained than the manufacturer's recommendations.

Accordingly, it would be extremely desirable to provide an encoder system having an improved velocity profile for incremental encoders that automatically optimizes the performance and reduces error conditions.

SUMMARY OF THE INVENTION

It is a principal object of the present invention to provide an encoder system that reduces hunting at low speeds.

It is a principal object of the present invention to provide an encoder system with an improved output error signal.

It is a principal object of the present invention to provide an encoder system that smoothes out and/or eliminates noise spikes and blips permitting higher maximum velocities without sacrificing position accuracy.

It is a principal object of the present invention to detect an illegal state change in an encoder system which may have been caused by noise and/or defective encoder equipment.

It is a principal object of the present invention to provide a real time diagnostic evaluation of loss of position or state error in an incremental encoder system.

It is a principal object of the present invention to increase the speed of operation of incremental encoders by performing real time processing of input signal distortions and maintaining such distortions within predetermined tolerances.

It is yet another object of the present invention to analyze both state errors and input signal errors to determine if the errors are the result of excessive speed or noise or are due to faulty encoders.

It is yet another object of the present invention to provide a novel digital filter that substantially eliminates errors introduced by analog input signals.

It is a general object of the present invention to detect high velocity conditions which could create errors before they occur.

It is a general object of the present invention to employ digital filtered position vectors to optimize the minimum and maximum velocity in an incremental encoder system.

It is a general object of the present invention to match output signals to commercially available servo-controllers so that the servo-controller can handle the data rate of the information being supplied without errors.

It is a general object of the present invention to provide diagnostic logic means for determining the magnitude of noise and encoder induced errors to determine the source of the error.

It is a general object of the present invention to provide a high speed encoder system that is readily assembled from commercially available components such as complex programmable logic devices, digital signal processors and application specific programmable devices.

According to these and other objects of the present invention there is provided an incremental encoder system which comprises a pair of sensor/encoders arranged as a quadrature pair for producing analog position signals that are converted to digital signals which define a digital position vector and the presence or absence of an error. The digital position vector and the digital error signals are processed in a high speed logic device that is programmable to produce a filtered quadrature output capable of defining the position of the sensor relative to the encoder scale and its velocity. The system removes noise spikes and determines if there has been an illegal state change or state error.

BRIEF DESCRIPTION OF THE DRAWINGS

FIG. 11 is a state error diagram showing four counter-clockwise changes of state when no error occurs;

FIG. 12 is a state error diagram showing four counter-clockwise changes of state when no error occurs;

FIG. 13 is a state error diagram showing two state changes that can occur in incremental encoders that are representative of a loss in position;

FIG. 14 is another state error diagram showing two state error changes that can occur in incremental encoders that are representative of a loss of position, and FIG. 15 is a table of binary position states at time T and the possible legal and illegal transition states that may occur at time T+1.

DESCRIPTION OF THE PREFERRED EMBODIMENTS

Figure 1:
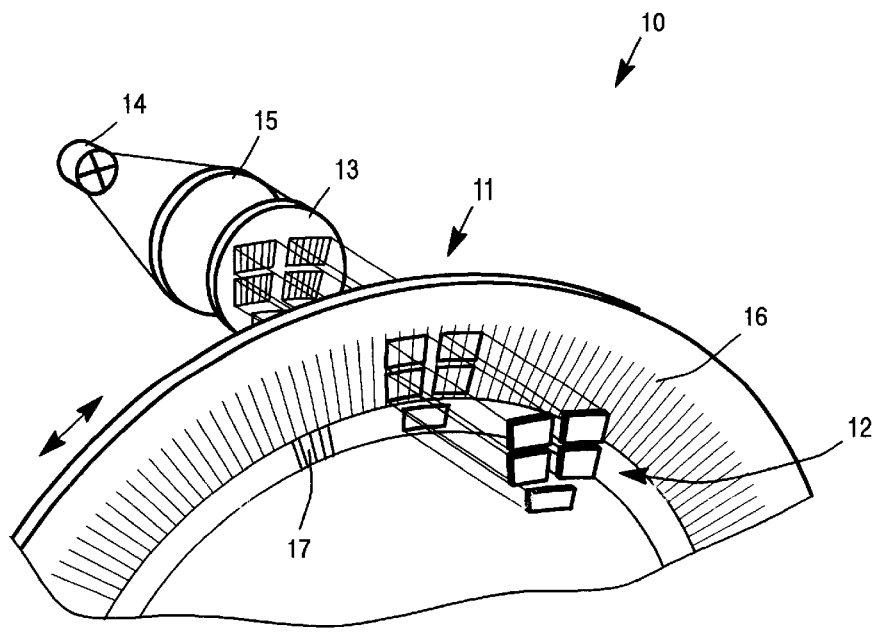
FIG. 1 is a schematic drawing in perspective of a rotary graduated disk and plural sensors comprising a prior art incremental encoder system.

Refer now to FIG. 1 showing a schematic drawing in perspective of a rotary scale incremental encoder 10 comprising a graduated disk 11 and photo-sensors 12. There are five photo-sensors 12 shown for producing analog waveform outputs and a reference signal as will be explained hereinafter. There is shown a scanning reticle 13 through which light passes produced by a light source 14 and a condenser lens 15. The light passes through the graduated scale 16 on the disk 11 and is sensed by the sensors 12. One of the sensors is employed to sense the reference mark 17 on the disk 11. The rotary scale incremental encoder 10 is typical of commercially available encoders.

Figure 2:
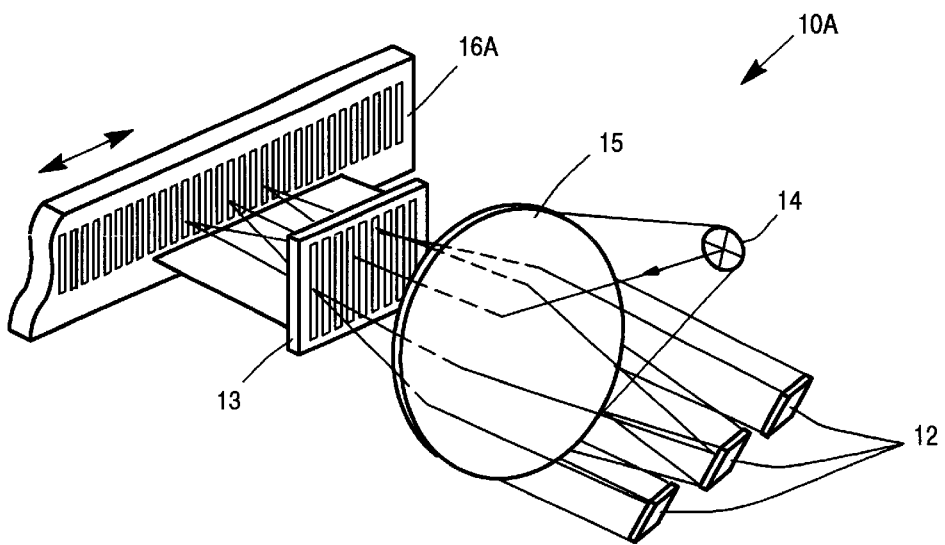
FIG. 2 is a schematic drawing in perspective view of a prior art linear reflective incremental encoder system.

Refer now to FIG. 2 showing a schematic drawing in perspective of a linear reflective incremental encoder 10A. Encoder 10A comprises a light source 14 and a condensing lens 15 through which passes collimated light through the scanning reticle 13 that is directed to the reflective scale 16A and reflected back through the scanning reticle 13 and condensing lens 15 to the sensors 12. The two outer sensors are used for the quadrature signals and the third or center sensor may be used for averaging or centering.

Figure 3:
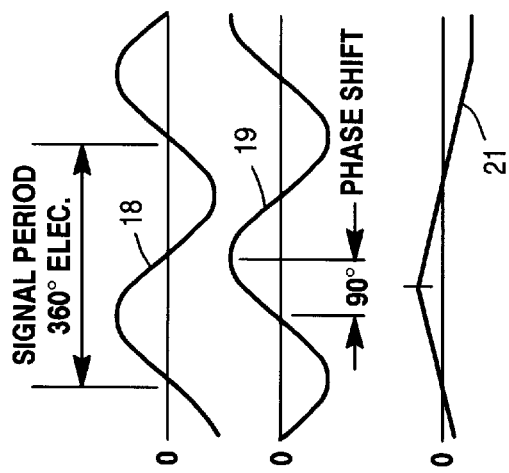
FIG. 3 is a schematic drawing of analog waveforms of the type produced by the sensors of the encoder systems of FIGS. 1 and 2.

Refer now to FIG. 3 showing a schematic drawing of analog waveforms produced by the sensors 12. The upper waveform 18 is an analog sensor sine wave output. The middle waveform is an analog sensor cosine output and the lower reference sensor output 21 is indicative of the voltage signal produced by the reference mark 17 shown in FIG. 1.

Figure 4:
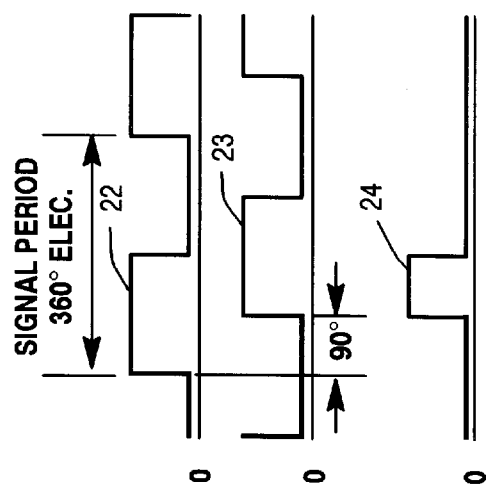
FIG. 4 is a drawing of the digital waveforms produced from the analog waveforms of FIG. 3.

Refer now to FIG. 4 showing a schematic drawing of digital waveforms that may be produced by some commercially available encoders and are usable directly into a servo-controller. The upper waveform 22 is indicative of a digitized sinusoidal output. The middle waveform 23 is indicative of a digitized cosine wave output and the lower waveform 24 is indicative of a reference sensor output. When the digitized measuring signals or sensor output signals shown in FIG. 4 are used directly into a servo-controller the actual position that can be determined is limited by the occurrence of the transitions that are already digitized whereas the use of the analog signals 18 and 19 represent an infinite number of positions.

Figure 5:
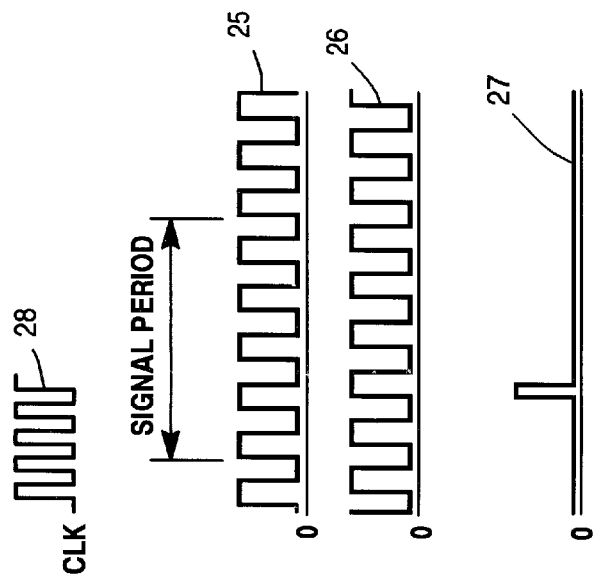
FIG. 5 is a drawing of plural digital waveforms shown in FIG. 3 and showing a synchronizing clock signal.

Refer now to FIG. 5 showing a drawing of plural digital waveforms that have been produced from the analog waveforms shown in FIG. 3. In this case the waveforms may be produced by a clock signal or other means known in the prior art. The waveform 25 and the cosine digitized waveform 26 are used as inputs to the servo-controller in the prior art as will be discussed hereinafter. Also the reference pulse 27 may be produced from the waveform 21 shown in FIG. 3 and employed in the circuit to be discussed hereinafter. The clock signal 28 is used for producing the pulses 25 through 27 and may be produced by known means not shown.

Figure 6:
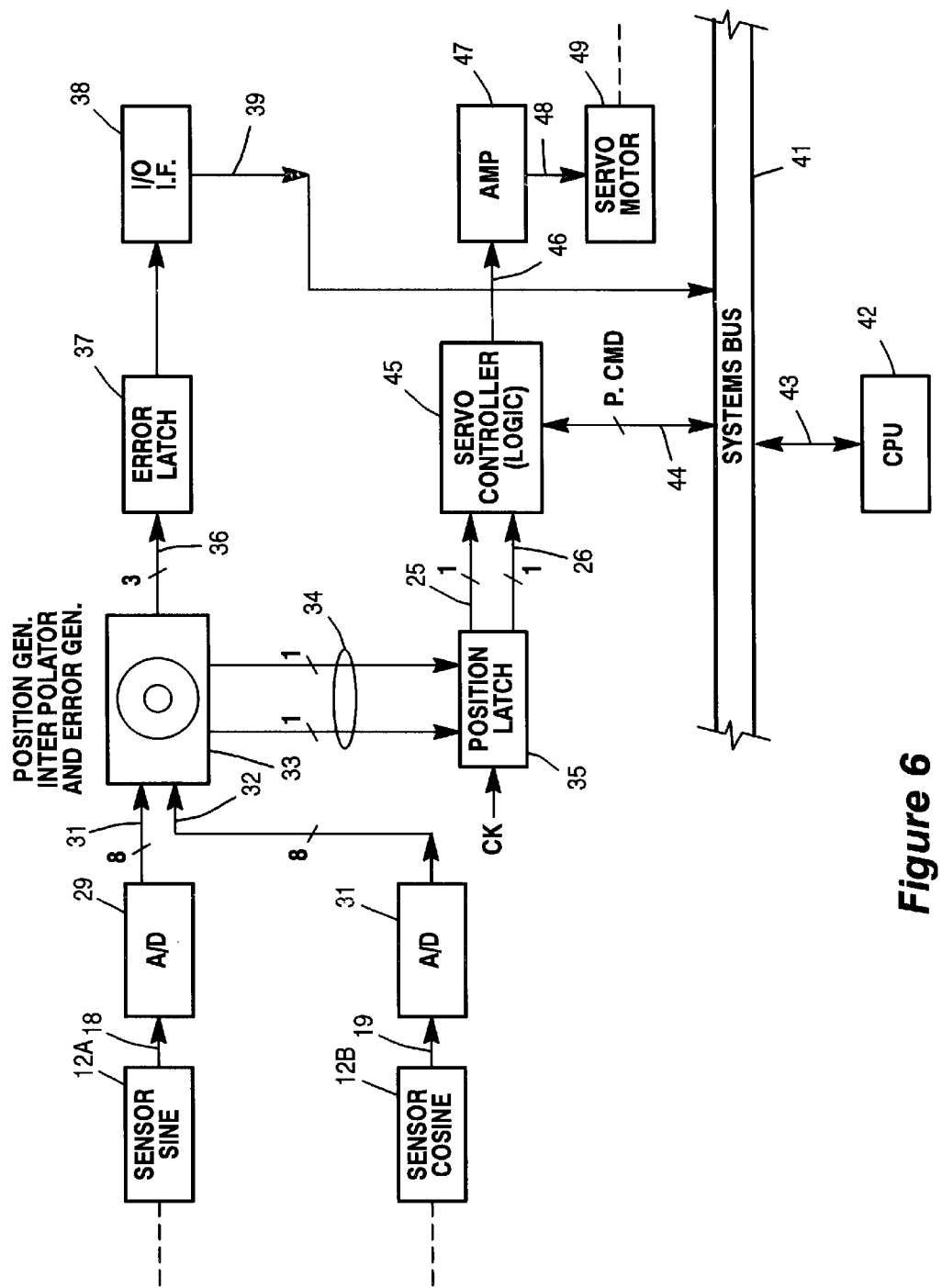
FIG. 6 is a schematic block diagram of a prior art servo-motor drive and control system using incremental encoder inputs of the type shown in FIG. 3.

Refer now to FIG. 6 showing a schematic block diagram of a prior art servomotor drive and control system using incremental encoder inputs of the type shown in FIG. 3. For purposes of this discussion, assume that the signals 18 and 19 discussed in FIG. 3 are on the lines 18 and 19 shown in FIG. 6. For purposes of this discussion, assume that the sensor 12A produces the analog sinusoidal signal 18 to the analog-to-digital converter 29 and the analog cosine wave 19 is inputted to the analog-to-digital converter 31.

The output of converters 29 and 31 are shown on lines 32 being inputted to an interpolator 33 to produce a position signal on lines 34 shown as two bits to the position latch 35. Also the interpolator is programmed to determine if the two digitized inputs on line 32 are out of specification so as to produce a three-bit error signal on line 36 for this example. The number of error bit signals is in part a function of what diagnostic means a user may require. The error signal is latched into error latch 37 and available to the IO interface 38. The IO interface 38 has the ability to create an error signal on line 39 which is communicated via bus 41 and line 43 to CPU 42 which can, in turn, generate a signal that shuts the system down or affects any one of the components such as the servocontroller and servomotor via line 44. The digital position on line 34 is applied to position latch 35 and produces the aforementioned quadrature signals 25 and 26 explained with reference to FIG. 5. The digitized quadrature signals 25 and 26 are applied to the servo-controller 45 and enable the logic in the controller to determine position and velocity.

The servo-controller 45 in turn generates a signal on line 46 which may be analog or digital to an appropriate amplifier 47 which generates an output signal on line 48 that will drive the servo 49 employed in the system.

If the input signals on lines 25 and 26 to the servo-controller 45 contain any blips or spikes or spurious noises, the servo-controller 45 can lose track of position and would incorrectly calculate the velocity.

Figure 7:
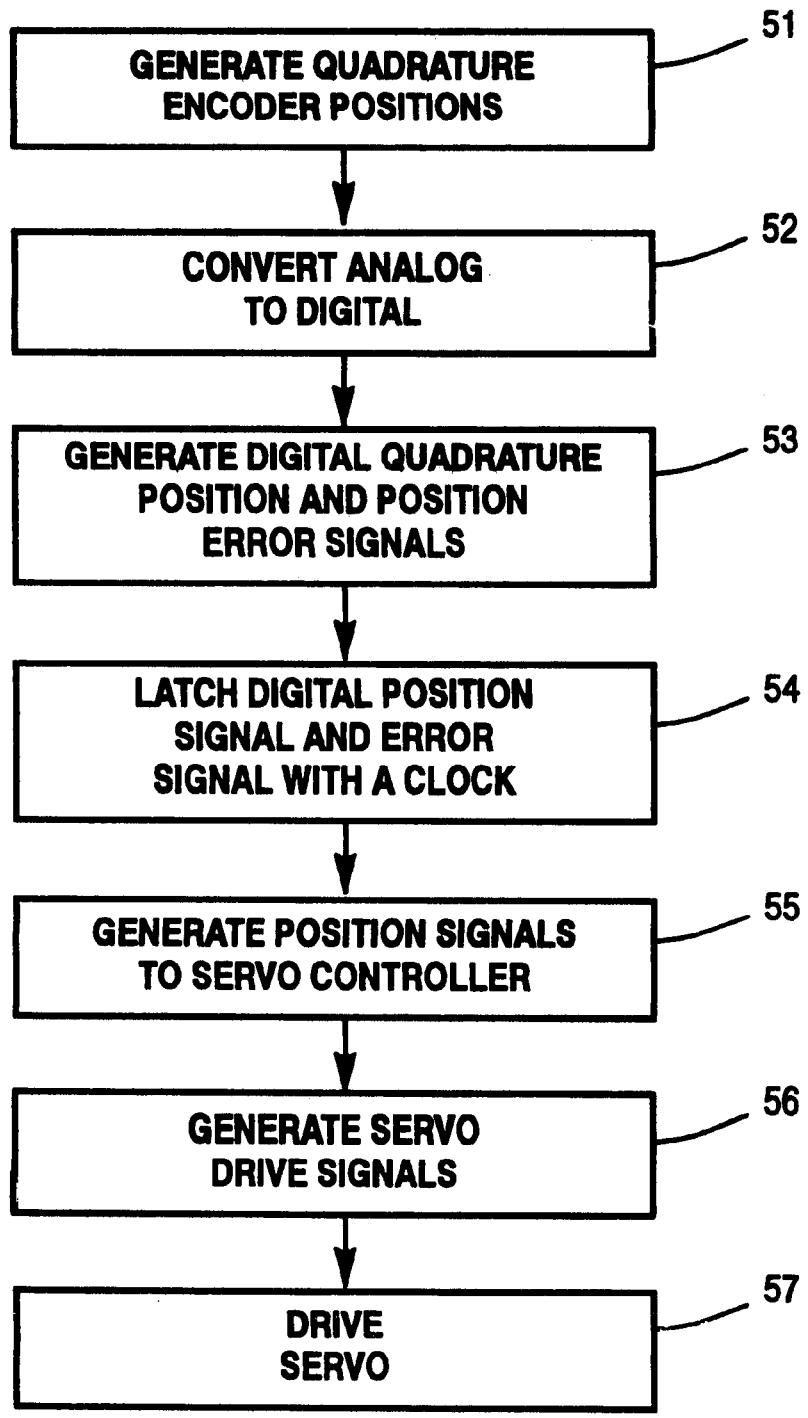
FIG. 7 is a flow diagram of the steps and functions which occur in the prior art system shown in FIG. 6.

Refer now to FIG. 7 showing a flow diagram of the steps and functions which occur in the prior art system shown in FIG. 6. The block 51 generates the quadrature encoder positions at 12A, 12B. Block 52 converts the analog signals to digital signals at converters 29 and 31. Block 53 generates the digital quadrature and position error signal in the interpolator 33 and outputs the signals on lines 34 and 36. The block 54 latches the digital position signal and error signal into latches 35 and 37. Block 55 generates the position signals to the servo-controller on lines 25 and 26. Block 56 generates the servo-drive signals and outputs them on line 46 utilizing servo-controller 45. The signal on line 46 is amplified in amplifier 47 and employed to drive an appropriate servo 49 as shown at block 57. The prior art encoder system FIG. 6 is typical of systems that are not capable of determining when an error signal has occurred or a condition prior to creation of such an error signal.

Figure 8:
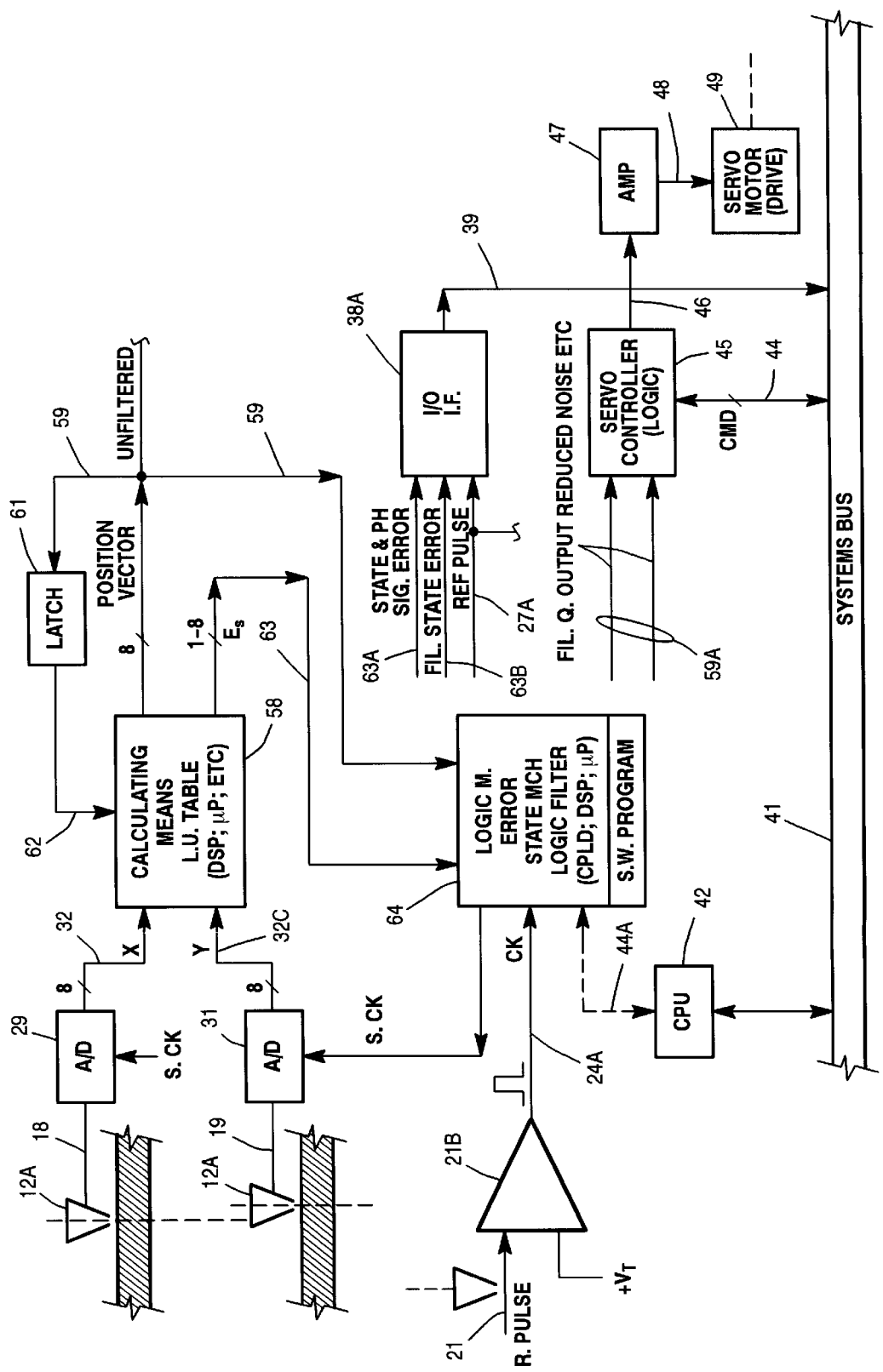
FIG. 8 is a schematic block diagram of the present invention servo-drive and control system for use with incremental encoder inputs.

Refer now to FIG. 8 showing a schematic block diagram of the present invention drive and control system for use with incremental encoder inputs. For the purpose of explaining the present invention distinctions over the prior art, a similar input system is shown even though direct digitized signals may be inputted into the logic means to be explained hereinafter. The sensor 12A creates a sinusoidal analog waveform on line 18 to the converter 29 for outputting a digital signal on line 32 representative of the analog sinusoidal signal. Similarly the sensor 12A outputs a cosine waveform on line 19 to analog the digital converter 31 for producing a digitized cosine waveform on line 32C. The X and Y components on lines 32 and 32C are applied to a novel calculating means 38 to be explained in greater detail hereinafter but may include look-up tables, digital signal processors, microprocessors, and other forms of calculating means. The calculating means produces a position vector shown as eight bits on line 59 which is unfiltered and may contain noise. The signal on line 59 is applied to a delay latch 61 and returned via line 62 to the calculating means 58 for determining state errors before filtering and may be an optional feature in the present invention. The calculating means 58 also produces a multibit error signal on line 63 which is applied to novel logic means 64 along with the position vector on line 59. The novel logic means includes means for detecting excessive rate change of position; means for detecting excessive noise coupling to the encoder; means for filtering the digital signals to be used to analyze the type of errors that have occurred and state logic means for determining the transition from a legal state to an illegal state as will be explained in greater detail hereinafter.

Logic means 64 produces state and phase error signals on line 63A to the IO interface 38A. There is shown a filtered state error signal on line 63B to the interface 38A. There is also shown a reference pulse on line 27A to the interface 38A. These signals are produced by the logic means 64. The reference signal on line 21 from the reference sensor is applied to a comparator 21B to provide a signal 24A similar to 24 which is inputted into logic means 64 for producing the reference pulse on line 27A to interface 38A. Similarly, the logic means 64 produces the filtered quadrature output signals on lines 59A with reduced noise to the servo-controller 45 which in turn produces a control signal to amplifier 47 which processes the control signal and produces an analog or digital signal on line 48 for controlling the servo 49. As explained hereinbefore, the signals that are outputted from IO interface 38A on line 39 are status signals which need to be adapted to the systems bus 41 so they may be processed in CPU 42 which can then issue instructions to the servo-controller via bus 41 and line 44. The filtered quadrature output signals on lines 59A are capable of optimizing the velocity of the servo-controller 45 being used. In order to do this, it is necessary to program into logic means 64 the critical velocity limits of the low and high velocities so that the logic means can determine when the servo-controller is approaching its limits of capability of handling the data rate. As an alternative, it is possible to have the logic means 64 directly communicate with the CPU 42 via line 44A if the servo-controller does not have this capability.

Figure 9:
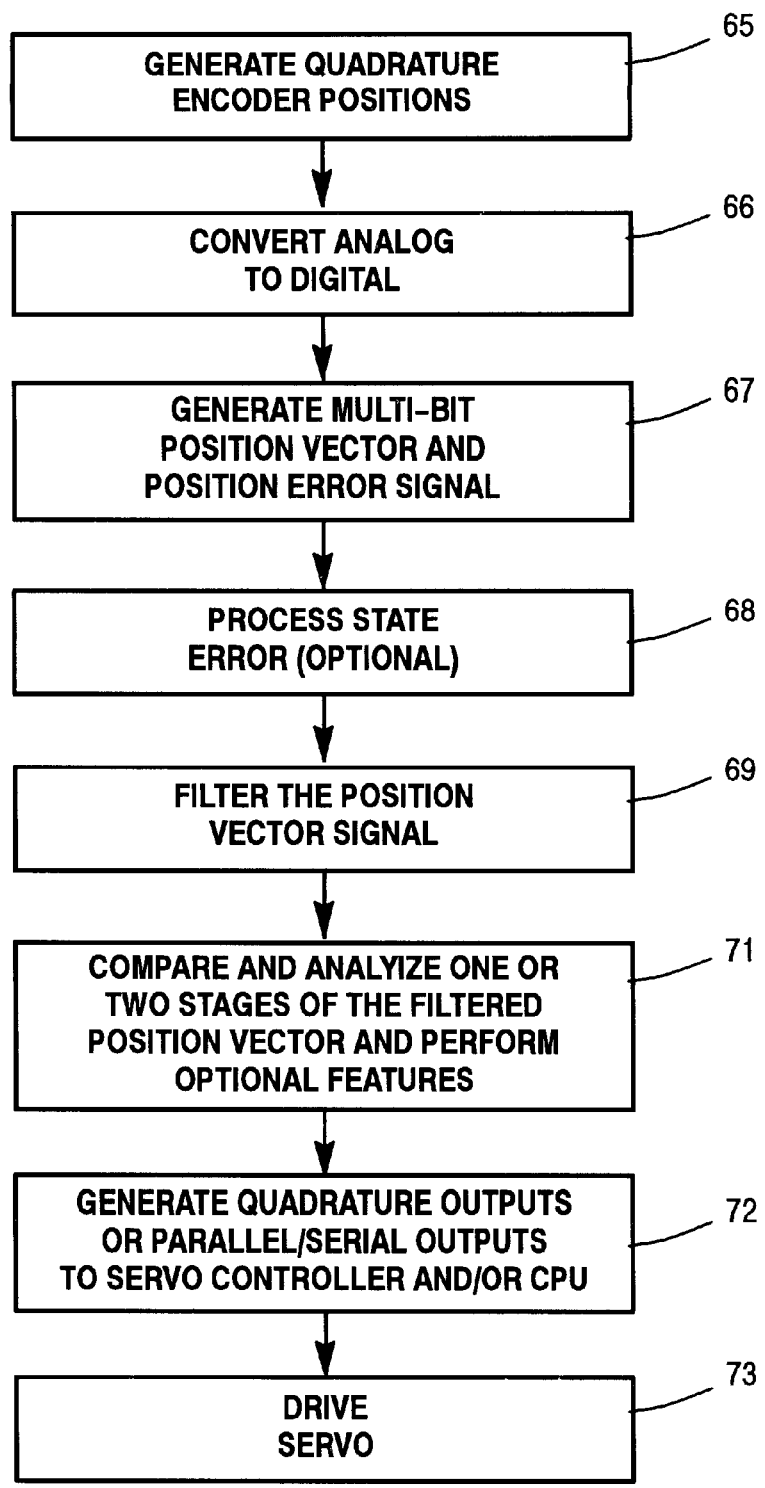
FIG. 9 is a flow diagram of the steps and functions performed in the present invention control system shown in FIG. 8.

Refer now to FIG. 9 showing a flow diagram of steps and functions performed in the present invention control system shown in FIG. 8. This flow diagram also includes a number of optional features which may be employed or may be omitted as necessary for operation of the servo-controller that is being employed in the system. Block 65 is shown generating a quadrature encoder position which is converted at block 66 to a digital signal for input to the calculating means 58. The calculating means 58 generates the multi-bit position vector in block 67 as well as the position multi-bit error signals. Block 68 processes the state error which is optional in the calculating means when this signal is available at line 62 from latch 61. Block 69 shows the function of filtering the digital position vector signal in the logic means 64. Block 71 illustrates the optional features which may be employed in logic means 64 such as comparing and analyzing vector signals at one or two stages of the digital filter and performing the optional features which will be explained hereinafter. Block 72 is shown generating the quadrature outputs on line 59A or parallel serial outputs to the servo-controller 45 and/or to the CPU 42. Block 73 illustrates the function of driving the servo 49 with the signals produced on line 46, amplifier 47 and line 48.

Figure 10:
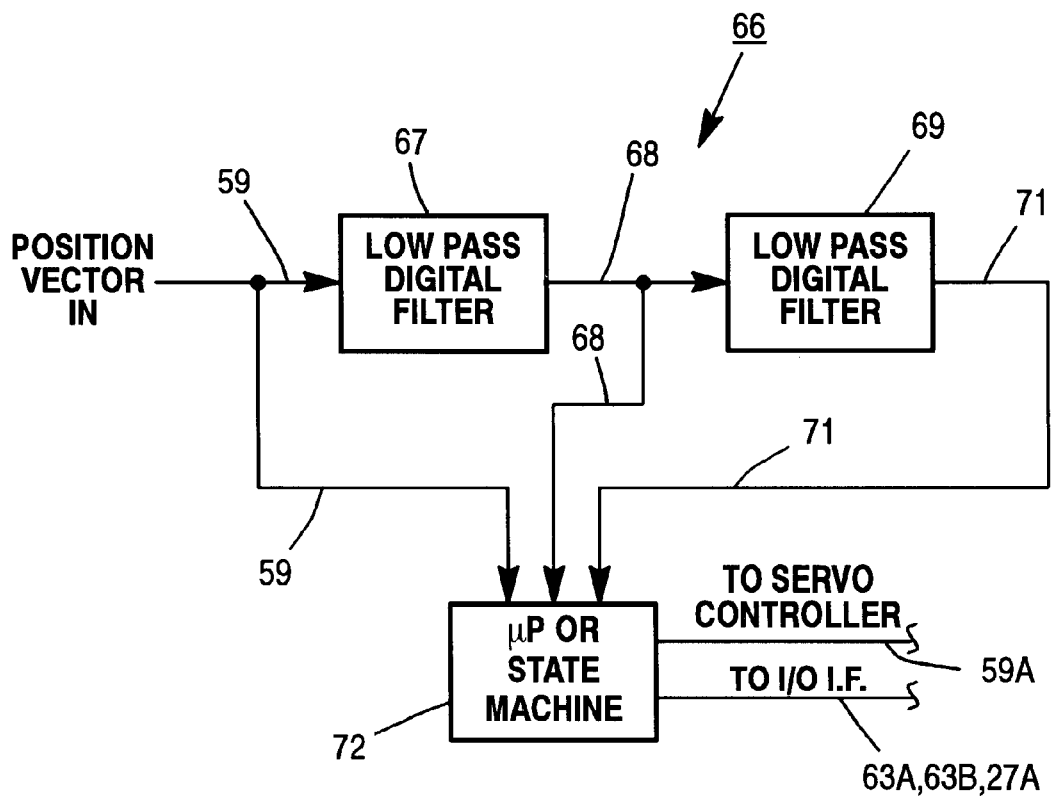
FIG. 10 is a block diagram of a digital filter of the type used in the logic circuits of FIG. 8.

Before explaining the optional features mentioned hereinbefore, refer now to FIG. 10 showing a digital filter 66 of the type used in the logic circuits of logic means 64. The position vector on line 59 is shown being applied to a first low pass digital filter 67 to produce a first filtered digital signal on line 68 which is applied to a second low pass digital filter 69 to produce a second filtered digital signal 71. The signals on lines 59, 68 and 71 are shown being applied to a microprocessor or state machine 72 which analyzes the signals and is capable of producing the novel control signals on lines 59A to the servo-controller 45 and on lines 63A, 63B and 27A to the IO interface 38A which are then coupled to the CPU 42.

It will be understood that by employing the novel digital filter shown in FIG. 10 the system is now capable of comparing and analyzing one or two stages of the filtered position vector to enable the system to detect effectiveness of the digital filter; to detect excessive rate of change of position; to avoid velocity conditions which could create state errors and position errors; and to detect excessive noise coupling that occurs in the encoders.

Refer now to FIGS. 11 through 14 showing state error diagrams which diagramatically represent the diagnostic and logic means 64 ability to determine state errors during transition. FIG. 11 shows a quadrature state error diagram illustrating the four binary clockwise conditions or changes of state when no error occurs. For example, it is perfectly legal to change from state 00 to state 10 without creating an error. Similarly it is possible to go from state 01 to state 00 without creating an error. FIG. 12 shows a similar condition where four counter-clockwise changes of state may be made without creating an error when analyzed in the logic means 64. For example, it is now possible to go from state 00 to state 01, etc. without creating any state error. However, FIG. 13 shows a state error diagram in which a state change occurs that is illegal and indicates that the incremental encoder has lost a position. It is illegal to go from state 00 to state 11 or from state 11 to state 00 because the transition must occur through the states 01 and/or state 10 to be permissible and legal. FIG. 14 shows the error condition when the state machine goes from state 01 to state 10 or from state 10 to state 01 without transitioning through the adjoining states.

Refer now to FIG. 15 showing a table of binary position states at time T and the possible legal and illegal transition states that may occur at time T+1. In column one there are shown four states, 01 through 10. These four quadrature states may change at time T+1 to the legal states shown in the second column to the right of time T. Thus, each one of the states shown in column T may stay the same or transition to an adjacent state as shown in the table of FIG. 15. Similarly, column three shows the transition to an illegal state of the type illustrated in FIGS. 13 and 14. When this condition occurs at time T+1 and the state condition previously at time T was shown in column one, then the incremental encoder has lost position. This table may be implemented into logic means 64 so that it can detect a state error or state transition error. When the error occurs the user can elect to send the error condition directly via line 44A to the CPU 42 or present the error condition to any of the sections of the system that can utilize the error condition and shut the machine down and/or warn the operator and/or allow the controller and the logic means to slow the machine down so that such errors do not occur again. In the preferred embodiment of the present invention, it is intended that the logic means, if properly programmed, can determine when the velocity conditions and the noise or spike or blip condition of the signals are on the verge of creating errors so that such conditions can be rectified before the errors occur.

Having explained a typical prior art servo-drive system for an incremental encoder and explaining that the prior art encoders did not optimize the velocity of the commercially available servo-controllers, it will be appreciated that the novel incremental encoder servo-drive shown in FIG. 8 is flexible enough to be programmed to operate in conjunction with numerous commercially available servo-controllers 45 and the intent of the system shown in FIG. 8 is to be able to employ commercially available components and still accomplish the novel results described hereinbefore.

What is claimed is:

1. An incremental encoder signal processing system, comprising:
   a pair of sensor/encoders for producing a quadrature pair of analog positioning signals,
   means for converting said pair of analog signals to digital signals,
   calculating means coupled to said pair of digital signals for producing a multi-bit digital position vector and a multi-bit digital error signal,
   said multi-bit digital positioning vector and multi-bit error signal comprising diagnostic data,
   system logic means coupled to said digital position vector and said digital error signal for detecting state errors in a change of magnitude of position in sequential position vectors,
   said system logic means comprising digital filter means for producing a quadrature pair of filtered digital output signals for driving a servo-controller without analog noise signals, and
   servo-drive means coupled to said digital filtered signals for positioning said encoders relative to said sensors.

2. A system as set forth in claim 1 wherein said system filter means comprises a plurality of low pass digital filters.

3. A system as set forth in claim 2 wherein said digital logic means comprises for analyzing the content of said position vector being passed through said digital filter means.

4. A system as set forth in claim 3 wherein said means for analyzing said position vector include means coupled to input/output interface, and
   processor means coupled to said input/output interface for generating signals for optimizing the velocity of said servo-drive means.

5. A system as set forth in claim 4 wherein said processor means comprises means for detecting excessive rate of change of position said servo-drive means.

6. A method set forth in claim 5 wherein said processor means comprises means for limiting or increasing the rate of change of position of said servo-drive means for avoiding velocity condition that could create errors.

7. A system as set forth in claim 3 wherein said means for analyzing said position vector compromises state machine means for comparing position vectors and filtered position vectors to determine the presence of error conditions.

8. A system as set forth in claim 3 wherein said means for analyzing said position vector includes means coupled to said servo-controller.

9. A system as set forth in claim 1 wherein said system logic means comprises means for determining the digital logic state of said position vector at two sequential times, and
   means for determining if the change from one state to a sequential state comprises a valid change in state.

10. A system as set forth in claim 9 wherein said valid change in logic state is determined by storing all valid changes in state in a memory.

11. A system as set forth in claim 9 wherein said valid change in logic state is determined by storing all invalid changes in state in a memory.

12. A system as set forth in claim 9 which further includes processor means coupled to said system logic means for receiving signals indicating of invalid changes in state.

13. A method of optimizing the rate of change of position in an incremental encoder system, comprising the steps of:
   generating a quadrature pair of analog position signals,
   converting said pair of analog position signals to digital signals,
   generating digital vector position signals,
   generating digital position error signals,
   applying said error signals and said vector position signals to digital logic means,
   analyzing said digital vector position signals for a change of state error,
   filtering said digital vector position signals,
   analyzing said digital filtered vector position signals to detect excessive noise and other conditions imposed on said analog position signals, and
   generating digital filtered quadrature output control signals for controlling a servo-controller.

14. A method as set forth in claim 13 wherein the step of analyzing said filtered vector position signals comprises detecting noise conditions in said vector position signals which could create errors.

15. A method as set forth in claim 13 wherein the step of analyzing said filtered vector position signals comprises detecting a rate of change of position that can cause errors.

16. A method as set forth in claim 13 wherein the step of analyzing said filtered vector position signals comprises detecting excess noise from the incremental encoders.

17. A method as set forth in claim 13 wherein the step of analyzing said filtered vector position signals comprises detecting the limits of effectiveness of said servo-controller.

* * * * *